US011503726B2

(12) United States Patent
Nguyen et al.

(10) Patent No.: US 11,503,726 B2
(45) Date of Patent: Nov. 15, 2022

(54) DISPLAY APPARATUS

(71) Applicant: SAMSUNG ELECTRONICS CO., LTD., Suwon-si (KR)

(72) Inventors: Huu Lam Vuong Nguyen, Suwon-si (KR); Bong Ju Lee, Suwon-si (KR); Kwang Sung Hwang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 97 days.

(21) Appl. No.: 16/353,545

(22) Filed: Mar. 14, 2019

(65) Prior Publication Data
US 2019/0289729 A1  Sep. 19, 2019

(30) Foreign Application Priority Data

Mar. 14, 2018 (KR) .......................... 10-2018-0029510

(51) Int. Cl.
| H05K 5/02 | (2006.01) |
| H01L 25/075 | (2006.01) |
| H05K 5/00 | (2006.01) |
| G09F 9/302 | (2006.01) |
| G09F 9/33 | (2006.01) |

(52) U.S. Cl.
CPC ......... H05K 5/0217 (2013.01); G09F 9/3026 (2013.01); H01L 25/0753 (2013.01); H05K 5/0017 (2013.01); *G09F 9/33* (2013.01)

(58) Field of Classification Search
CPC .. H05K 5/0217; H05K 5/0017; G09F 9/3026; G09F 9/33; H01L 25/0753

USPC ............................................................ 257/88
See application file for complete search history.

(56) References Cited

U.S. PATENT DOCUMENTS

| 2015/0055279 A1 | 2/2015 | McBroom et al. |
| 2016/0210886 A1 | 7/2016 | Brashnyk et al. |
| 2016/0231976 A1 | 8/2016 | Ryu et al. |
| 2017/0006727 A1 | 1/2017 | Ryu et al. |

FOREIGN PATENT DOCUMENTS

| CN | 204178650 | 2/2015 |
| CN | 106463083 A | 2/2017 |
| JP | 2016-142861 | 8/2016 |
| JP | 2018-506748 | 3/2018 |
| KR | 20-0464801 | 2/2013 |
| KR | 10-2017-0000575 | 1/2017 |
| KR | 10-2018-0011983 | 2/2018 |
| WO | 2016/109439 | 7/2016 |
| WO | 2018/021672 | 2/2018 |

OTHER PUBLICATIONS

Extended European Search Report dated Jul. 23, 2019 in European Patent Application No. 19162317.2.

(Continued)

*Primary Examiner* — Ori Nadav
(74) *Attorney, Agent, or Firm* — Staas & Halsey LLP

(57) ABSTRACT

Disclosed is a display apparatus including an LED module having a first fastening member, a front bracket having a second fastening member on which the LED module is mounted by an attractive force generated between the first and second fastening members, and at least one level adjusting member disposed on the LED module and configured to adjust a level difference between the LED module and another adjacent LED module.

17 Claims, 20 Drawing Sheets

(56) References Cited

OTHER PUBLICATIONS

International Search Report and Written Opinion of the International Searching Authority dated Jul. 12, 2019 in International Patent Application No. PCT/KR2019/002863.
European Office Action dated Jun. 10, 2020 in European Patent Application No. 19162317.2.
Indian Office Action for Indian Patent Application No. 202017042128 dated Dec. 1, 2021.
European Office Action for European Patent Application No. 19 162 317.2 dated Aug. 24, 2021.
Chinese Office Action for Chinese Patent Application No. 201980018555.X dated Sep. 27, 2021.
Korean Office Action dated Mar. 31, 2022 in Korean Patent Application No. 10-2018-0029510 (8 pages, 12 pages English translation).
Korean Notice of Allowance dated Oct. 6, 2022 in Korean Patent Application No. 10-2018-0029510 (3 pages; 1 page English translation).

DISPLAY APPARATUS

CROSS-REFERENCE TO RELATED APPLICATION(S)

This application is based on and claims priority under 35 U.S.C. § 119 to Korean Patent Application No. 10-2018-0029510, filed on Mar. 14, 2018 in the Korean Intellectual Property Office, the disclosure of which is incorporated by reference herein in its entirety.

BACKGROUND

1. Technical Field

The present disclosure relates to a display apparatus, and more particularly, to a display apparatus improved in an assembling structure.

2. Description of the Related Art

A light-emitting diode (LED) display apparatus may basically realize a large-sized screen using a small-sized LED panel.

Conventionally, LED display apparatuses having a large pitch between LEDs arranged on an LED panel have been mainly used as a large-sized outdoor display apparatus.

However, in recent years, as demand for a large-sized display apparatus with high image quality has increased, various studies have been conducted on a display apparatus having a small pitch between LEDs arranged on an LED panel.

In addition, as demand for a very large display apparatus or an indoor large-sized display device has increased recently, various studies have been conducted on a display apparatus that is easy to move and install.

SUMMARY

It is an aspect of the present disclosure to provide a display module capable of adjusting a level difference between a plurality of LED panels included in the display module.

Further, it is an aspect of the present disclosure to provide a display module that is easy to move and install.

Further, it is an aspect of the present disclosure to provide a display apparatus capable of facilitating coupling between a plurality of display modules included in the display apparatus and adjusting a level difference between the plurality of display modules.

Additional aspects of the present disclosure will be set forth in part in the description which follows and, in part, will be obvious from the description, or may be learned by practice of the disclosure.

In accordance with an aspect of the present disclosure, a display apparatus includes an LED module having a first fastening member, a front bracket having a second fastening member on which the LED module is mountable by an attractive force generated between the first and second fastening members, and at least one level adjusting member disposed at the LED module. The at least one level adjusting member is configured to move the LED module in a direction opposite to a direction of the attractive force generated between the first fastening member and the second fastening member, wherein the at least one level adjusting member is linearly moveable with respect to the LED module while the at least one level adjusting member is being rotated by an external magnetic force, performs a level adjustment movement in which the LED module moves with respect to the front bracket when the at least one level adjusting member is restricted from being linearly moveable by the front bracket.

The LED module and the at least one level adjusting member may be configured to move relative to each other.

The at least one level adjusting member may rotatably contact the front bracket and the front bracket restricts the at least one level adjusting member from being linearly moveable while in contact with the front bracket.

The at least one level adjusting member may move between a standby position in which the at least one level adjusting member is spaced apart from the front bracket and a level adjustment position in which the at least one level adjusting member causes the level adjustment movement of the LED module.

The at least one level adjusting member may be configured to maintain contact with the front bracket while the level adjustment movement of the LED module while the at least one level adjusting member is in the level adjustment position.

The LED module may include an LED panel, and a module bracket disposed on a rear surface of the LED panel and on which the at least one level adjusting member is movably disposed.

The at least one level adjusting member may include a member body having threads formed on an outer circumferential surface thereof so as to be screw-movable with respect to the module bracket, and a plurality of adjusting magnets fixedly disposed inside the member body to generate an attraction force together with the external magnetic force.

The at least one level adjusting member may include a contact protrusion having a curved contact surface, the contact protrusion formed to protrude from one surface of the member body facing the front bracket, and the front bracket may include at least one contact plate facing the at least one level adjusting member which the curved contact surface rotatably contacts while the at least one level adjusting member is at the level adjustment position.

The threads may include square threads having a square cross section to maintain a position of the LED module with respect to the front bracket.

The one level adjusting member is rotated in a first rotational movement in which the at least one level adjusting member is moved from the standby position to the level adjustment position, and a second rotational movement in which the at least one level adjusting member is moved from the level adjustment position to the standby position, the second rotational movement being in a direction opposite to a direction of the first rotational movement, and the at least one level adjusting member may include a moving stopper protruding from a circumference of the member body to prevent a movement in the direction of the second rotational movement from the standby position by being restricted by the module bracket.

The at least one level adjusting member may be positioned between the LED panel and the front bracket unexposed to an outside.

The LED panel may include a plurality of edges forming a circumference thereof, and the at least one level adjusting member may be among a plurality of the level adjusting members each corresponding to the plurality of edges for level adjustment at the plurality of edges.

The LED module may be mounted on the front bracket by the attractive force, and a distance between the LED module and the front bracket may be adjusted by the at least one level adjusting member.

The at least one level adjusting member may be disposed on the LED module so as to be spaced apart from the first and second fastening members.

The at least one level adjusting member may be configured to adjust a level difference between the LED module and another adjacent LED module.

In accordance with another aspect of the present disclosure, a display apparatus includes an LED module including an LED panel and a module bracket to support a rear surface of the LED panel, a front bracket on which the LED module is mountable, and at least one level adjusting member disposed on the module bracket to adjust a level difference between the LED module and another LED module adjacent to the LED module, wherein the at least one level adjusting member includes a plurality of adjusting magnets rotationally moving by an external magnetic force, and a member body in which the plurality of adjusting magnets are fixedly disposed, the member body being configured such that a linear movement thereof is restricted by contacting the front bracket, and the at least one level adjusting member is configured to be linearly moveable and perform a level adjustment movement in which the LED module moves with respect to the front bracket when the linear movement of the member body is restricted by contacting the front bracket.

The at least one level adjusting member may be configured to maintain contact with the front bracket while the level adjustment movement of the LED module is performed.

In accordance with another aspect of the present disclosure, a display apparatus includes an LED module, a front bracket on which the LED module is mounted, and at least one level adjusting member configured to adjust a distance between the LED module and the front bracket and to move relative to the LED module by a magnetic force.

The at least one level adjusting member may be is linearly moveable with respect to the LED module by an external magnetic force while being rotated, and performs a lifting movement of the LED module with respect to the front bracket when the at least one level adjusting member is restricted from being linearly moveable by the front bracket.

In accordance with another aspect of the present disclosure, a display apparatus includes an LED module, a front bracket on which the LED module is mounted, and at least one level adjusting member configured to adjust a distance between the LED module and the front bracket, wherein the at least one level adjusting member includes a plurality of adjusting magnets configured to exert an attractive force with a magnetic jig positioned in front of the LED module and to rotate together with the rotation of the magnetic jig, and a member body rotating with the plurality of adjusting magnets and converting the rotation into a linear movement, and the at least one level adjusting member is configured to contact the front bracket and linearly move to push out the LED module from the front bracket.

BRIEF DESCRIPTION OF THE DRAWINGS

These and/or other aspects, features, and advantages of certain embodiments of the present disclosure will become more apparent and more readily appreciated from the following description, taken in conjunction with the accompanying drawings of which.

DETAILED DESCRIPTION

Figure 1:
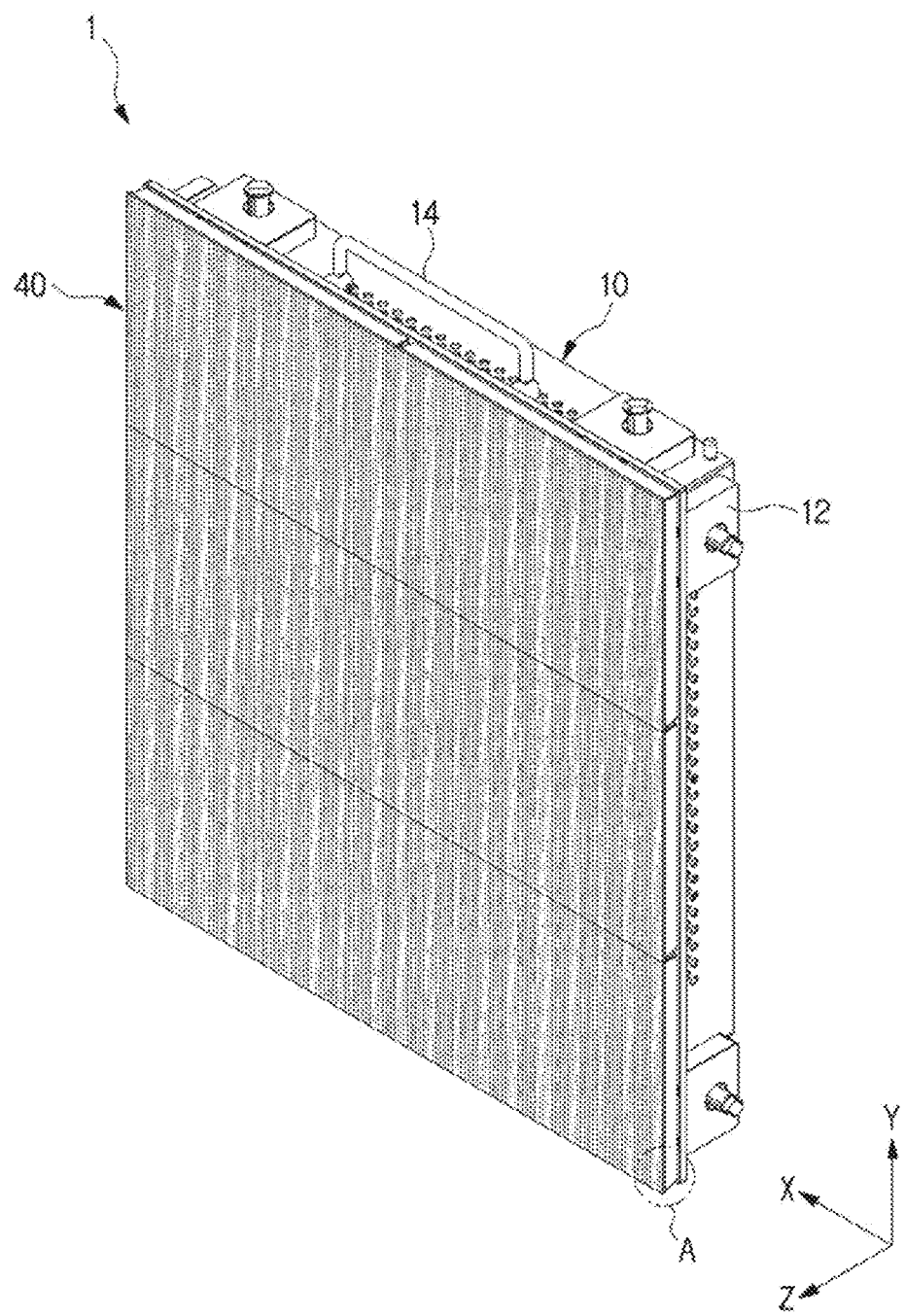
FIG. 1 is a perspective view of a display apparatus according to an embodiment of the present disclosure.

The embodiments described herein and the configurations shown in the drawings are only examples of preferred embodiments of the present disclosure, and various modifications may be made at the time of filing of the present disclosure to replace the embodiments and drawings of the present specification.

Like reference numbers or designations in the various figures of the present application represent parts or components that perform substantially the same functions.

Hereinafter, embodiments of a washing machine and a control method thereof will be described in detail with reference to the accompanying drawings.

The terms used herein are for the purpose of describing the embodiments and are not intended to restrict and/or to limit the disclosure. For example, the singular expressions herein may include plural expressions, unless the context clearly dictates otherwise. Also, the terms "comprises" and "has" are intended to indicate that there are features, numbers, levels, operations, elements, parts, or combinations thereof described in the specification, and do not exclude the presence or addition of one or more other features, numbers, levels, operations, elements, parts, or combinations thereof.

It will be understood that, although the terms first, second, etc. may be used herein to describe various components, these components should not be limited by these terms. These terms are only used to distinguish one component from another without limiting the components. For example, without departing from the scope of the present disclosure, the first component may be referred to as a second component, and similarly, the second component may also be referred to as a first component. The term "and/or" includes any combination of a plurality of related items or any one of a plurality of related items.

Hereinafter, embodiments according to the present disclosure will be described in detail with reference to the accompanying drawings.

Figure 2:
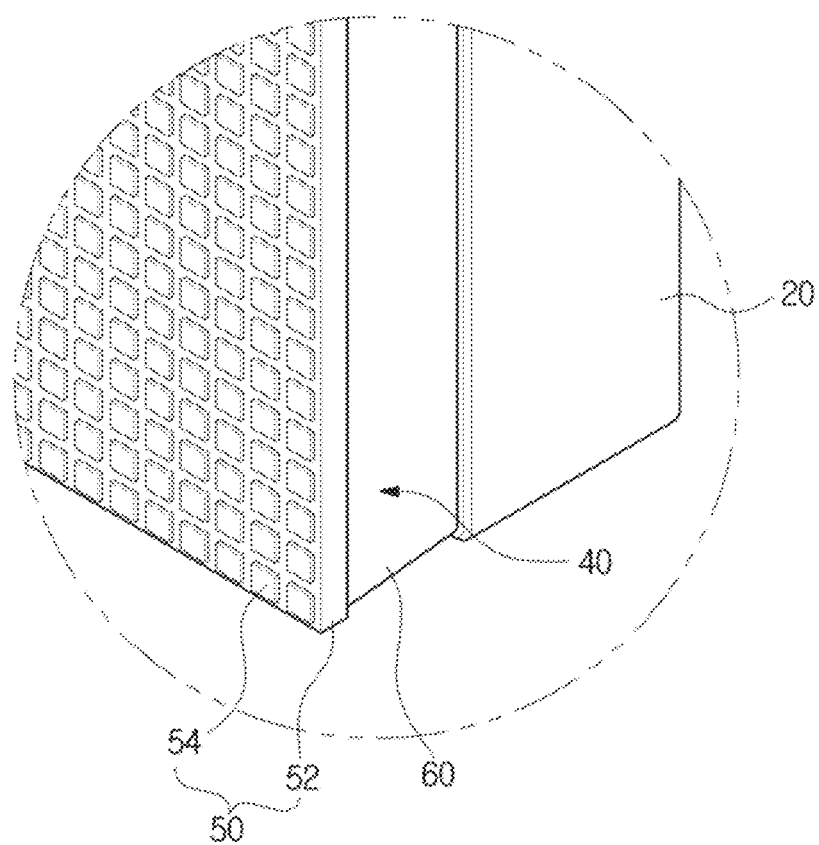
FIG. 2 is an enlarged view of mark A in FIG. 1.
Figure 3:
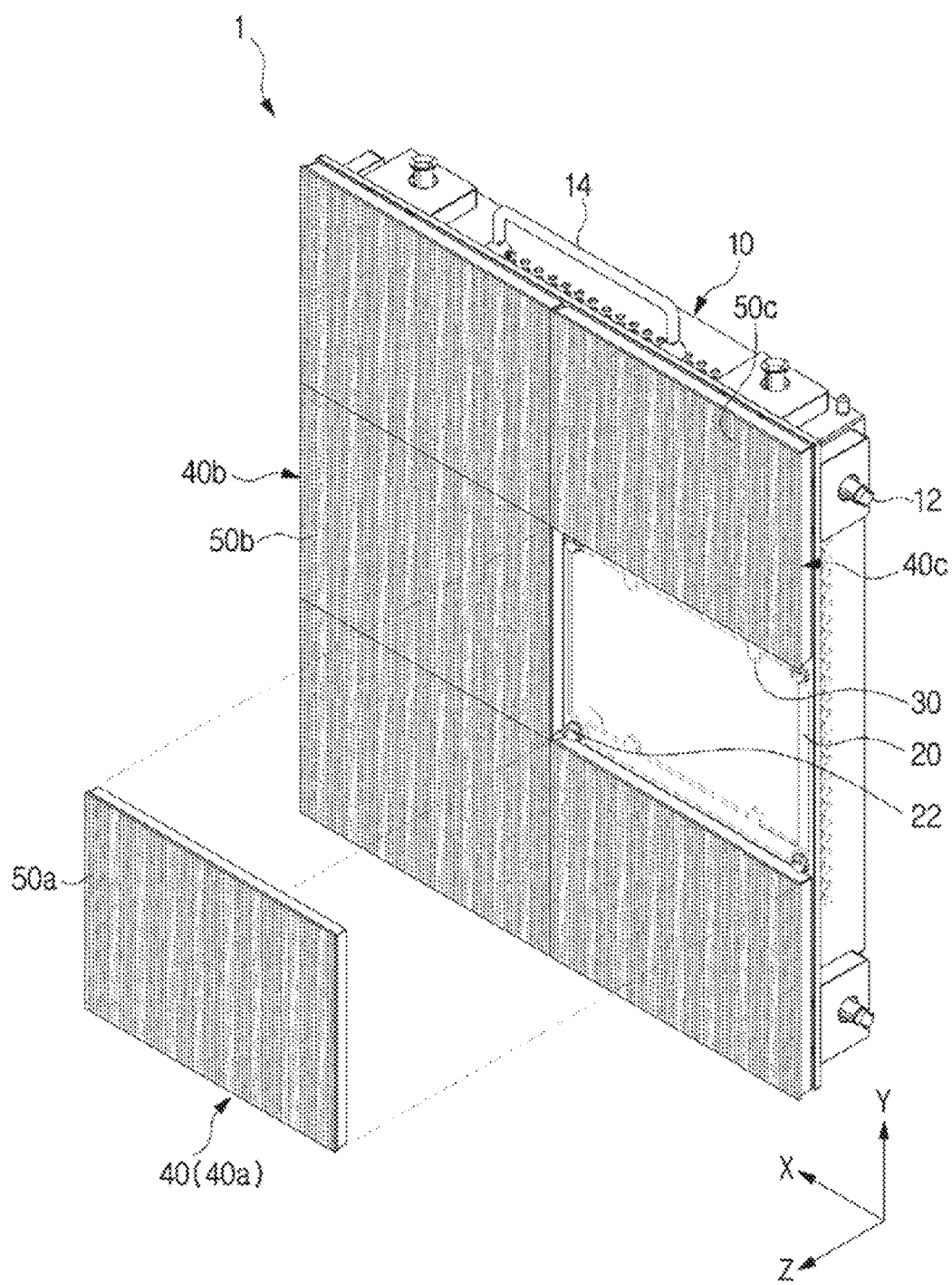
FIG. 3 is a partially exploded perspective view of a display apparatus according to an embodiment of the present disclosure.
Figure 4:
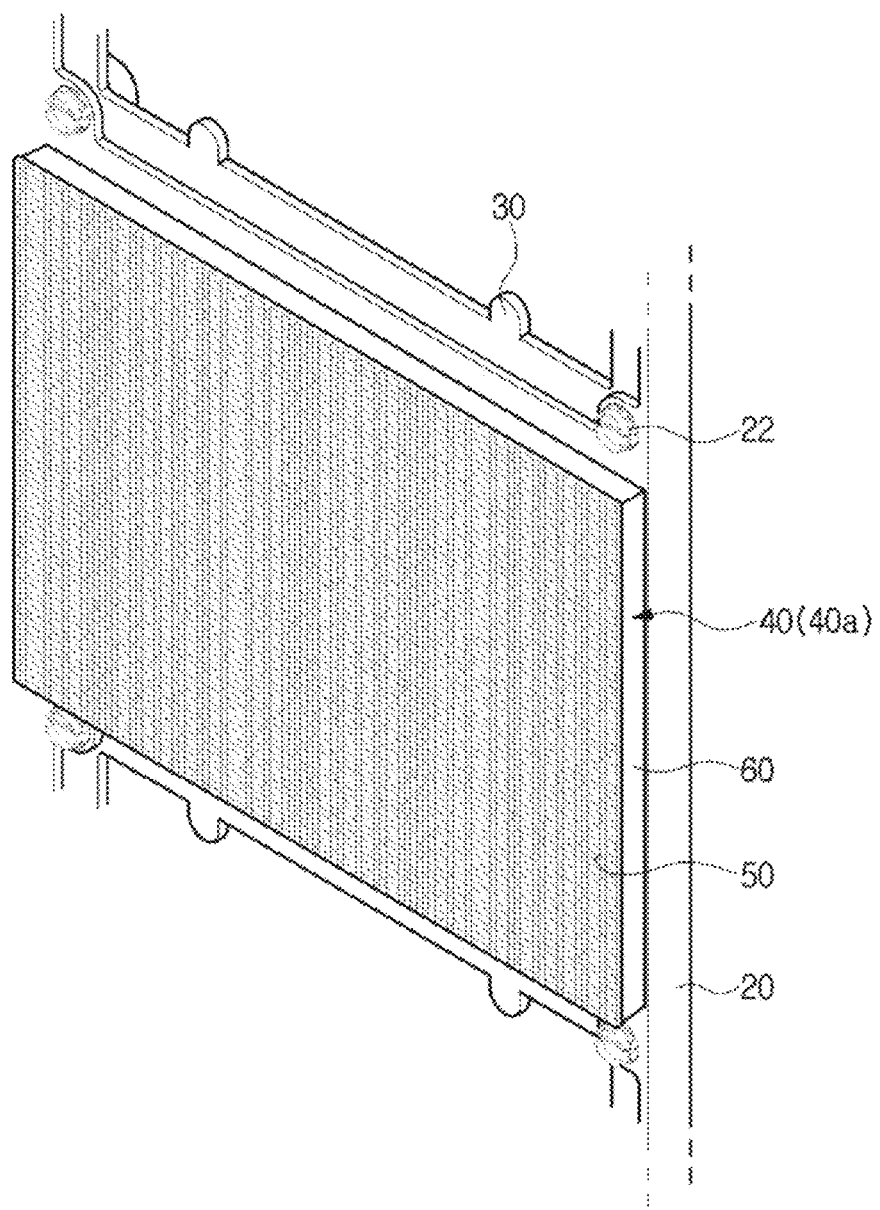
FIG. 4 is an enlarged view of an LED module of a display apparatus according to an embodiment of the present disclosure.
Figure 5:
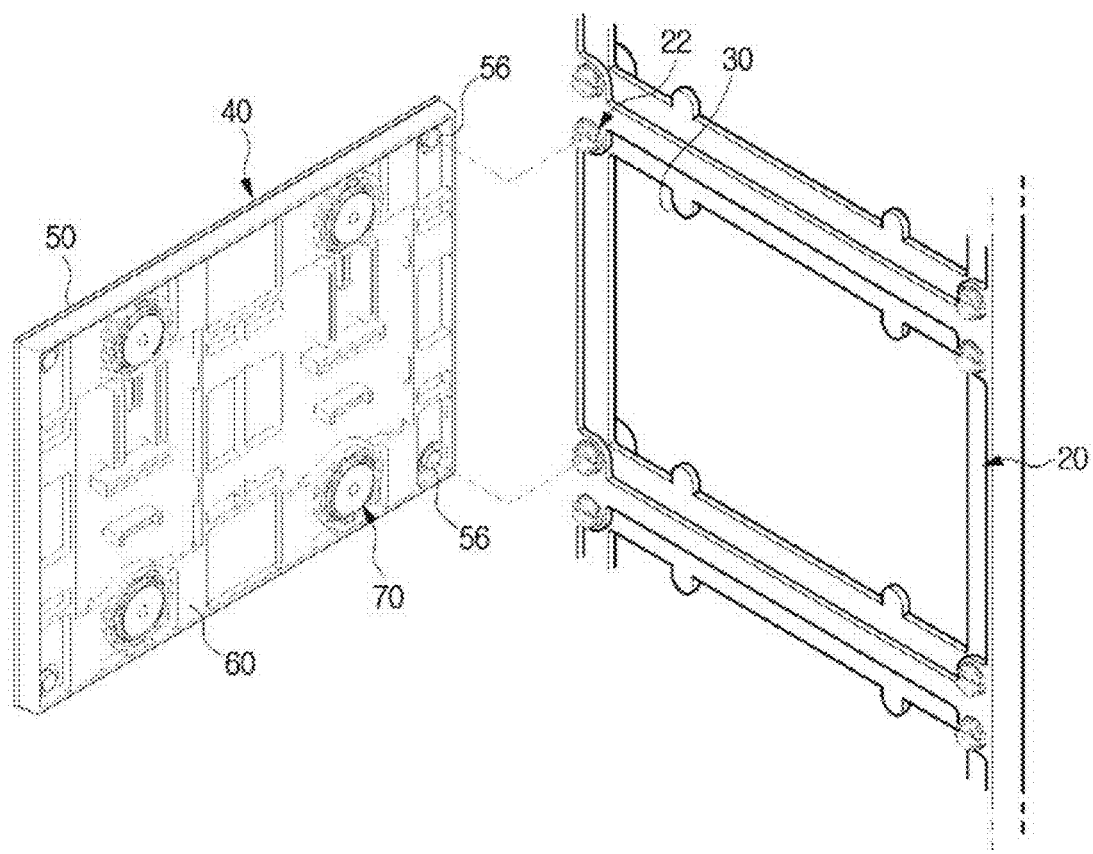
FIG. 5 is a view illustrating a state in which an LED module and a front bracket are separated from each other in a display apparatus according to an embodiment of the present disclosure.
Figure 6:
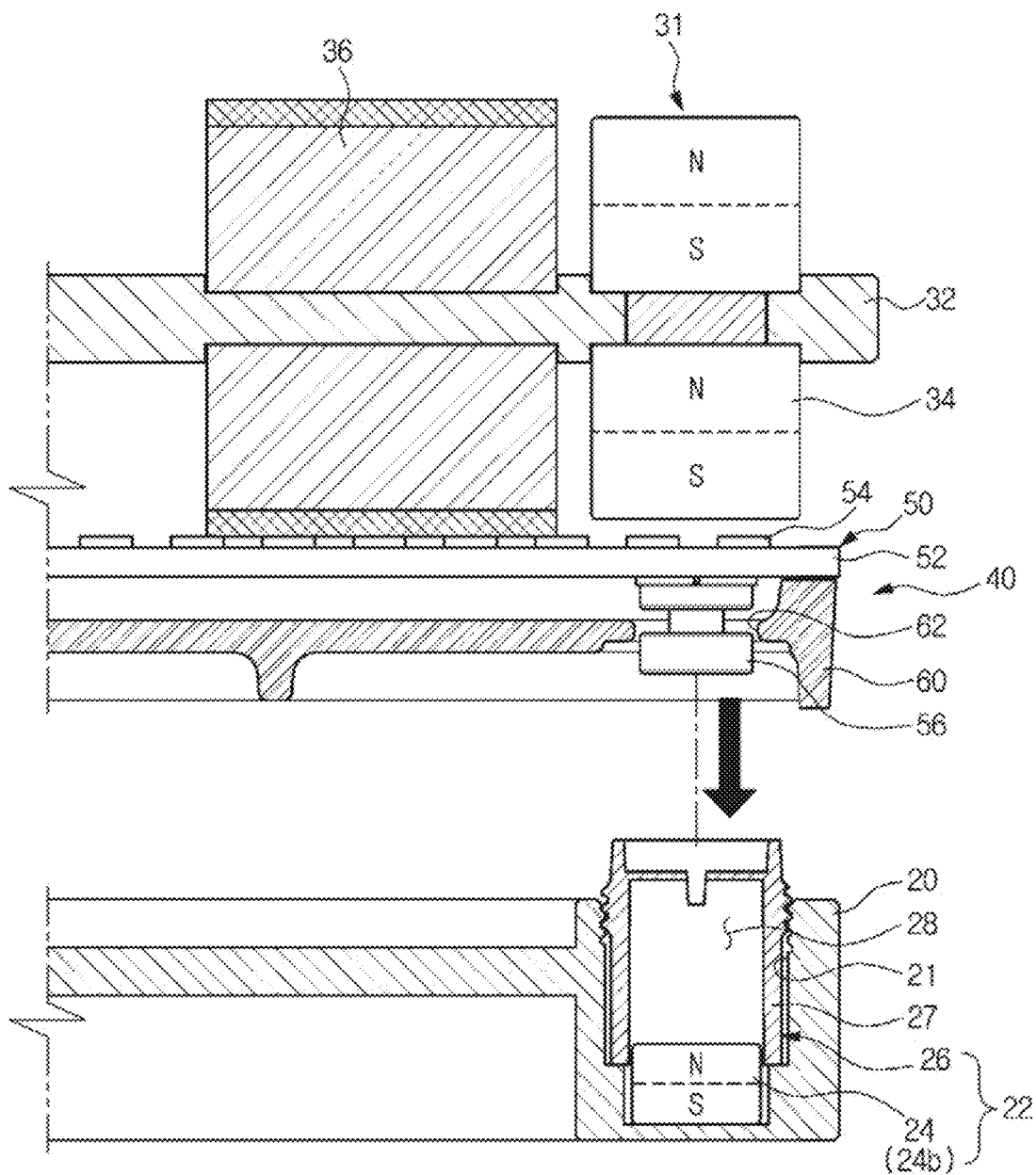
FIGS. 6 to 9 illustrate a process in which an LED module and a front bracket are coupled to each other in a display apparatus according to an embodiment of the present disclosure.
Figure 7:
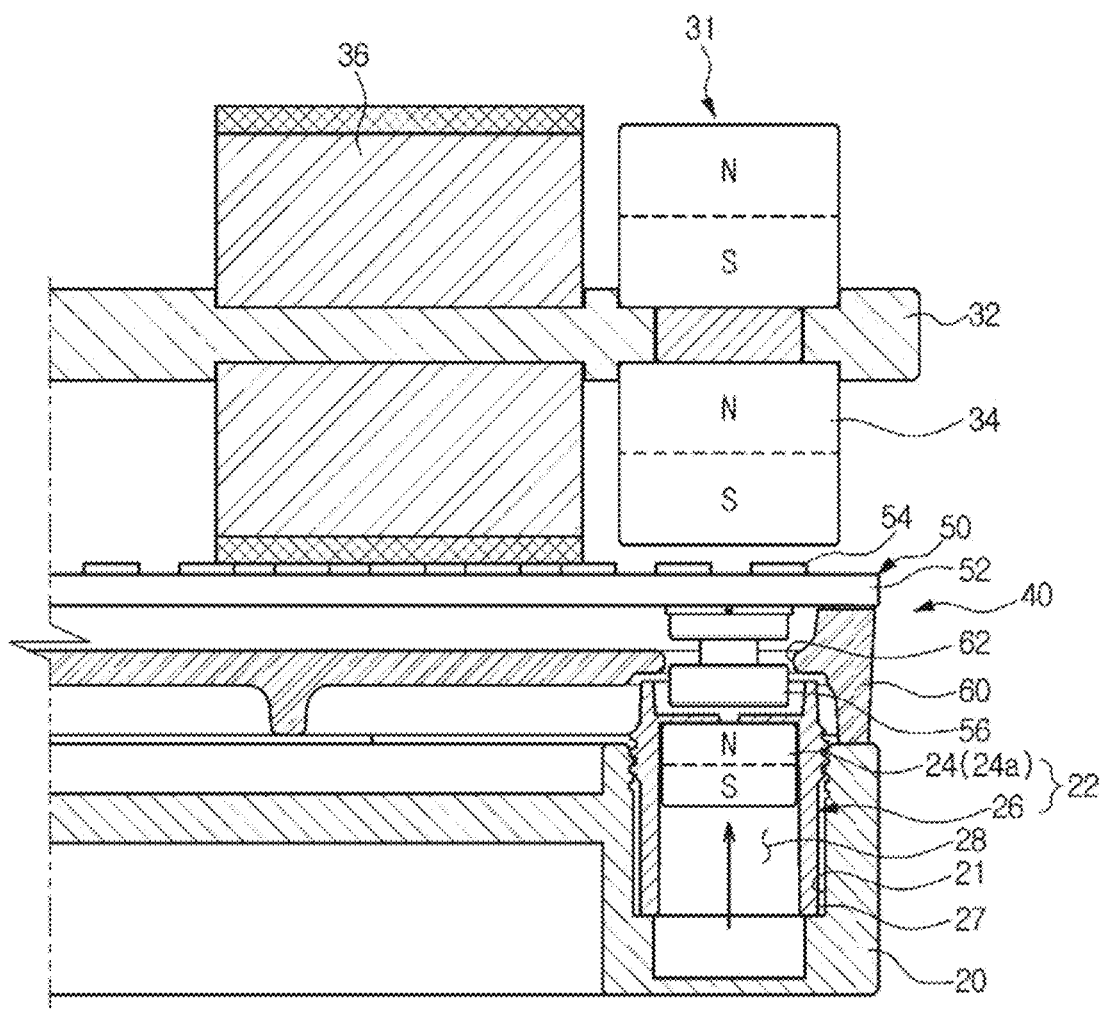
Figure 8:
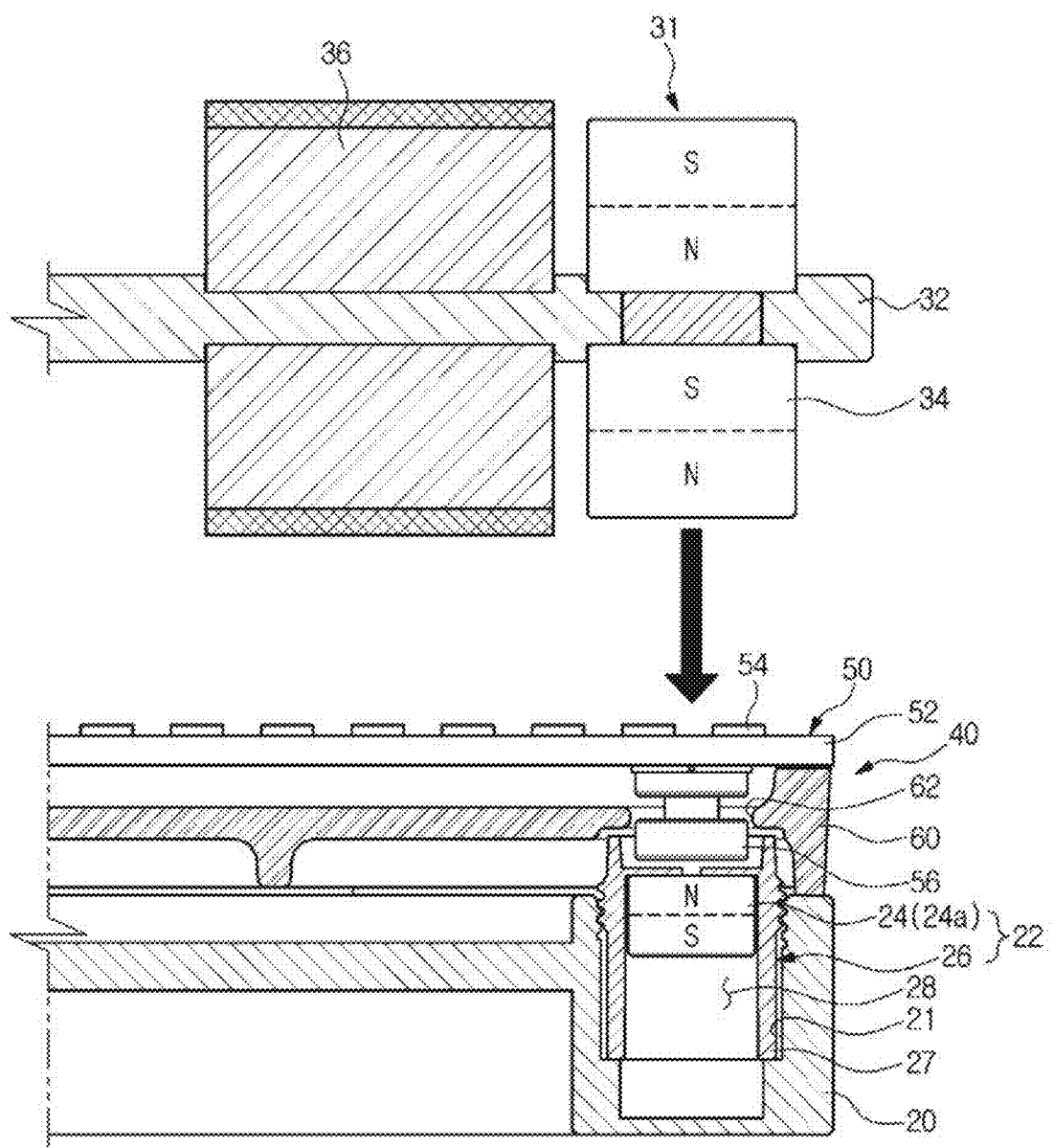
Figure 9:
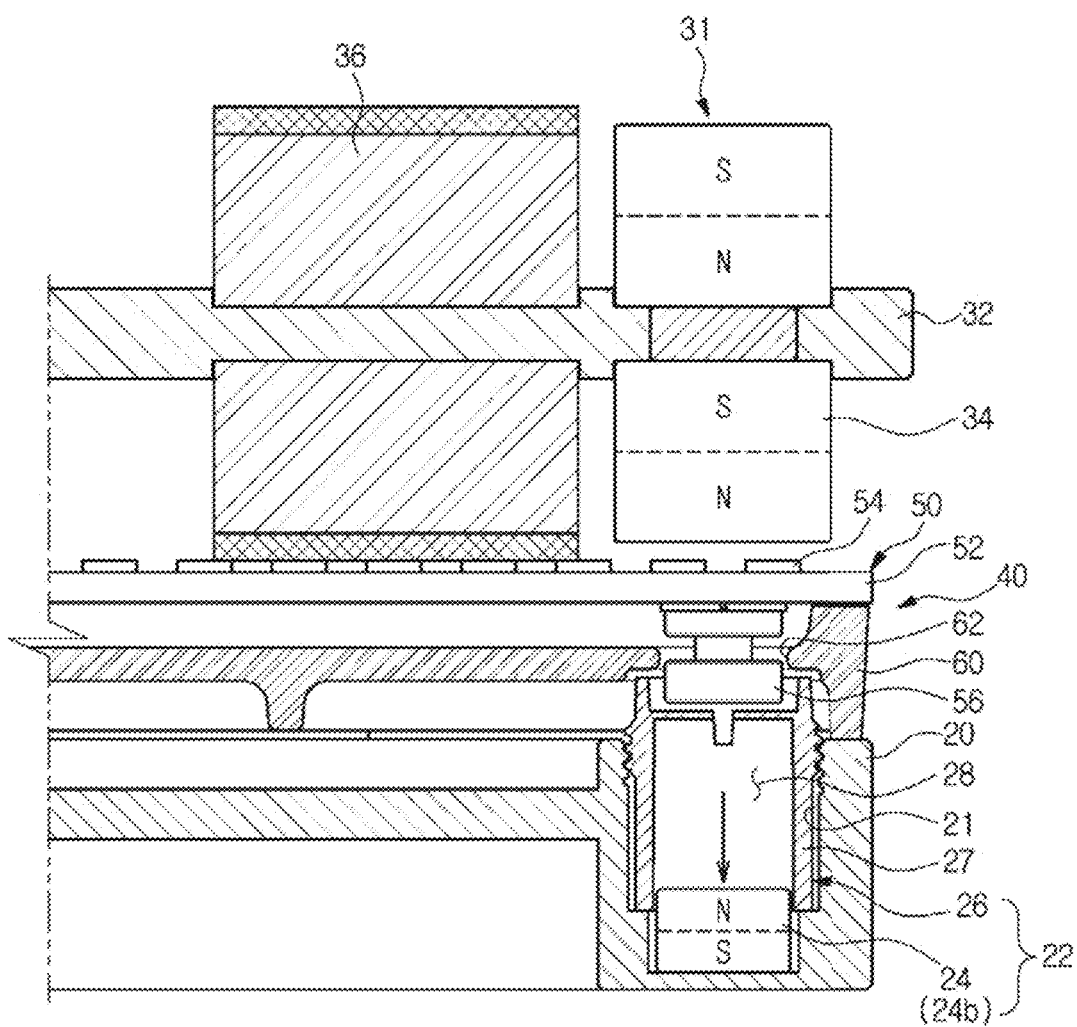

FIG. 1 is a perspective view of a display apparatus according to an embodiment of the present disclosure, FIG. 2 is an enlarged view of mark A in FIG. 1, FIG. 3 is a partially exploded perspective view of a display apparatus according to an embodiment of the present disclosure, FIG. 4 is an enlarged view of an LED module of a display apparatus according to an embodiment of the present disclosure, and FIG. 5 is a view illustrating a state in which an LED module and a front bracket are separated from each other in a display apparatus according to an embodiment of the present disclosure.

A display apparatus 1 may include a cabinet 10 and a plurality of LED modules 40 mounted on the cabinet 10.

The cabinet 10 may include a connection device 12 capable of connecting the display apparatus 1 to another display apparatus. The cabinet 10 may include a handle 14 for facilitating the movement of the display apparatus 1. The handle 14 may be rotated and stored so as not to protrude outside the display apparatus 1 when the display apparatus 1 is connected to another display apparatus.

The cabinet 10 may include a plurality of front brackets 20 on which the plurality of LED modules 40 are mounted. The plurality of LED modules 40 may be disposed on the corresponding plurality of front brackets 20, respectively.

The LED module 40 may include an LED panel 50. The LED panel 50 may include a LED substrate 52 on which a plurality of LEDs 54 are arranged. When a plurality of the LED panels 50 are mounted on the cabinet 10, a boundary line or a seam may be formed between the LED panels 50 disposed adjacent to each other. When the size of the LEDs 54 arranged on the LED panel 50 becomes small in order to form a high-quality image, the distance between the LEDs 54 becomes small. In this case, if the distance between the LED panels 50 is larger than the distance between the LEDs 54, or if a level difference is generated between the LED panels 50, the boundary line between the LED panels 50 is visible.

The display apparatus 1 may include a level adjusting member 70 (refer to FIG. 5) to adjust a level difference between the LED panels 50 in order to prevent a level or a boundary line between the LED panels 50 from occurring. The level adjusting member 70 will be described later in detail.

The display apparatus 1 may include a plurality of the LED modules 40. Each of the plurality of LED modules 40 may include the LED panel 50. The plurality of LED modules 40 may include a first LED module 40a and a second LED module 40b arranged in a first direction X with respect to the first LED module 40a. The first LED module 40a may include a first LED panel 50a and the second LED module 40b may include a second LED panel 50b. The plurality of LED modules 40 may also include a third LED module 40c arranged in a second direction Y with respect to the first LED module 40a. The third LED module 40c may include a third LED panel 50c. The first and second directions may be the left-right direction and the up-down direction, respectively. In this embodiment, the LED modules 40 arranged in 2×3 are illustrated, but the present disclosure is not limited thereto. That is, the number and arrangement pattern of the LED modules 40 may be variously changed. In other words, while the LED module 40 is explained herein using an exemplary arrangement and configuration, the present invention is not limited thereto and may be any device, assembly or member having a light source of one or more LEDs in any arrangement that are connectable to each other and other fixture(s)/device(s).

The LED module 40 may include a first fastening member 56 (refer to FIG. 5). The first fastening member 56 may be attached to the front bracket 20 by being magnetized by an external magnetic force or may be detached from the front bracket 20. The first fastening member 56 may be disposed on a rear surface of the LED panel 50. The first fastening member 56 may be provided at each corner of the rear surface of the LED panel 50 to provide a total of four fastening members. However, the number and arrangement of the first fastening members 56 are not limited thereto. For example, the number of first fastening members 56 may be disposed more than the number of corners of the LED panel 50. The first fastening member 56 may also be disposed on a virtual line passing the center point of the LED panel 50.

At least one of the first fastening members 56 may be configured to protrude from the rear surface of the LED panel 50. The end portion of the first fastening member 56 may be formed in a flat or irregular shape. The first fastening member 56 may include a material that may be magnetized by a magnet. For example, the first fastening member 56 may include steel or free-cutting steel or the like. The first fastening member 56 may be fixed to the LED panel 50 by soldering or the like.

A plurality of the front brackets 20 may be provided so as to correspond to a plurality of the LED modules 40. The plurality of front brackets 20 may be configured to be fixed to the cabinet 10. The material of the front bracket 20 may include aluminum or an aluminum alloy. The material of the front bracket 20 may include a paramagnetic metal (or paramagnetic alloy). Also, the material of the front bracket 20 may include a non-magnetic metal (or non-magnetic alloy).

The front bracket 20 may be divided into sections corresponding to the number of the LED modules 40. That is, if the array of the LED modules 40 is 2×3, the sections of the front bracket 20 may also be divided into 2×3.

The front bracket 20 may include second fastening members 22 corresponding to the first fastening members 56 of the LED module 40. The second fastening members 22 may be configured to correspond to the number of the first fastening members 56.

FIGS. 6 to 9 illustrate a process in which an LED module and a front bracket are coupled to each other in a display apparatus according to an embodiment of the present disclosure. The description will also be made with reference to the above-mentioned drawings.

The second fastening member 22 may include a mounting magnet 24 and a threaded cap 26. The threaded cap 26 is configured to accommodate the mounting magnet 24. The threaded cap 26 may include a cap body 27 and a magnet accommodating space 28 formed inside the cap body 27. The mounting magnet 24 may be provided to be movable in the magnet accommodating space 28. The mounting magnet 24 may move between a mounting position 24a positioned at an upper portion of the magnet accommodating space 28 and a separating position 24b positioned at a lower portion of the magnet accommodating space 28.

The front bracket 20 may include an accommodating groove 21 for accommodating the threaded cap 26. Female threads may be formed on the accommodating groove 21, and male threads may be formed on an outer circumferential surface of the cap body 27. With this configuration, the threaded cap 26 may be screwed into the accommodating groove 21. However, the present disclosure is not limited thereto, and the threaded cap 26 may be fixed to the accommodating groove 21 by another manner.

The mounting magnet 24 may be disposed inside the threaded cap 26. The mounting magnet 24 may be movably provided inside the threaded cap 26 corresponding to the polarity of the magnetized first fastening member 56. The mounting magnet 24 is disposed in the magnet accommodation space 28 and configured to be movable corresponding to the magnetized first fastening member 56. The first fastening member 56 of the LED module 40 magnetized by the magnet may be fixed by the magnet of the second fastening member 22 positioned in the front bracket 20.

A fastening jig 31 may include a jig body 32 and a fastening magnet 34 disposed on the jig body 32. The size of the fastening jig 31 may correspond to the size of the LED module 40. The fastening magnets 34 may have the number and arrangement corresponding to the first fastening members 56. With this configuration, when the fastening jig 31 approaches the LED module 40, the first fastening member 56 is configured to be magnetized by the fastening magnet 34.

The fastening jig 31 may include an impact absorbing member 36. The impact absorbing member 36 may be configured such that the fastening magnet 34 does not contact the LED panel 50 in order to protect the LEDs 54. That is, the impact absorbing member 36 may be configured such that the fastening magnet 34 does not contact the LED panel 50 when the fastening jig 31 is disposed on a front surface of the LED panel 50. The impact absorbing member 36 may include at least one of urethane, silicone, and rubber.

When the fastening jig 31 contacts a front surface of the LED module 40, the first fastening member 56 of the LED module 40 is magnetized by the magnet of the fastening jig 31. When the fastening magnet 34 facing the LED module 40 is the S pole, the first fastening member 56 may be magnetized with the N pole at an upper portion thereof and the S pole at a lower portion thereof. The mounting magnet 24 may have the N pole at an upper portion thereof and the S pole at a lower portion thereof, and is moved to the mounting position 24a, which is located at an upper portion of the magnet accommodating space 28, by the attraction with the magnetized first fastening member 56. Thereby, the LED module 40 may be mounted on the front bracket 20 by an attractive force between the first and second fastening members 56 and 22. For convenience of explanation, an upper portion of the mounting magnet 24 has the N pole and a lower portion of the mounting magnet 24 has the S pole, but the present disclosure is not limited thereto.

On the contrary, when the fastening magnet 34 facing the LED module 40 is the N pole, the first fastening member 56 may be magnetized with the S pole at the upper portion thereof and the N pole at the lower portion thereof. Since the mounting magnet 24 is the N pole at the upper portion thereof and the S pole at the lower portion thereof, a repulsive force is generated between the mounting magnet 24 and the first fastening member 56 so that the mounting magnet 24 is moved to the separating position 24b which is located at the lower portion of the magnet accommodating space 28. Thereby, the LED module 40 may be separated from the front bracket 20 by the repulsion between the first and second fastening members 56 and 22.

Figure 10:
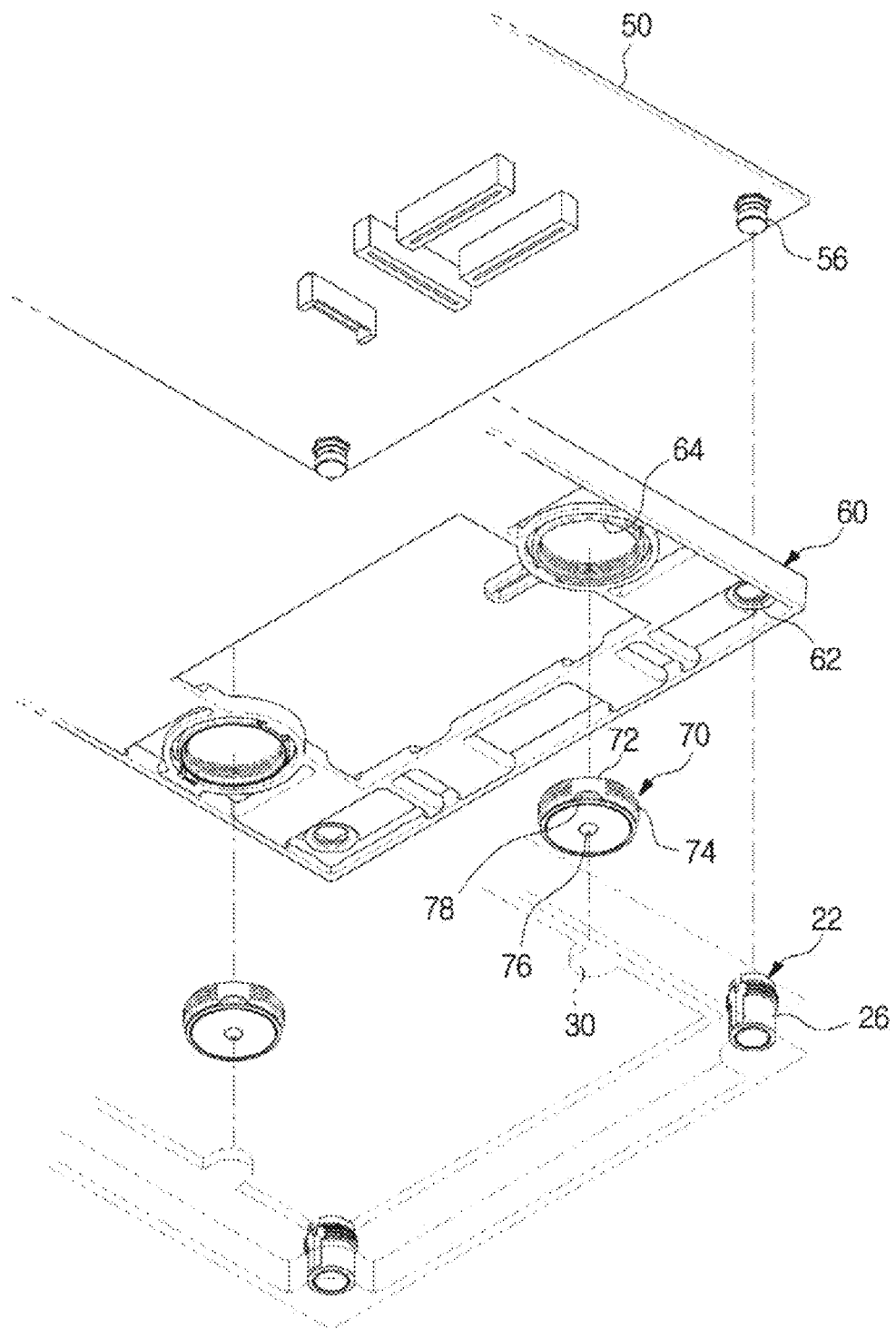
FIG. 10 is an exploded perspective view of an LED module and a level adjusting member in a display apparatus according to an embodiment of the present disclosure.
Figure 11:
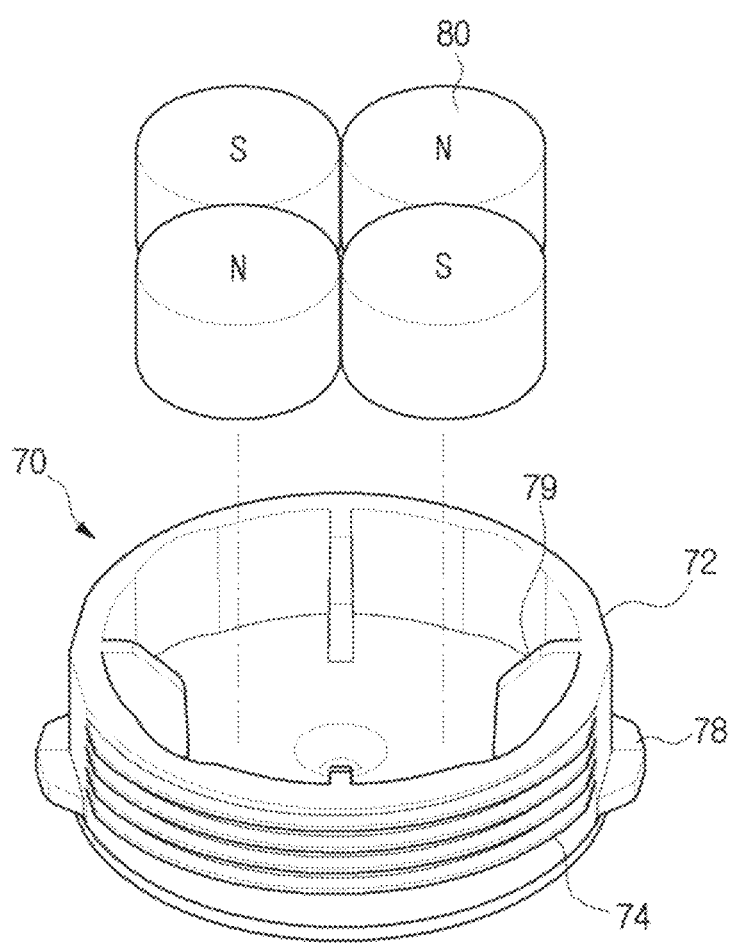
FIG. 11 is an exploded perspective view of a level adjusting member in a display apparatus according to an embodiment of the present disclosure.
Figure 12:
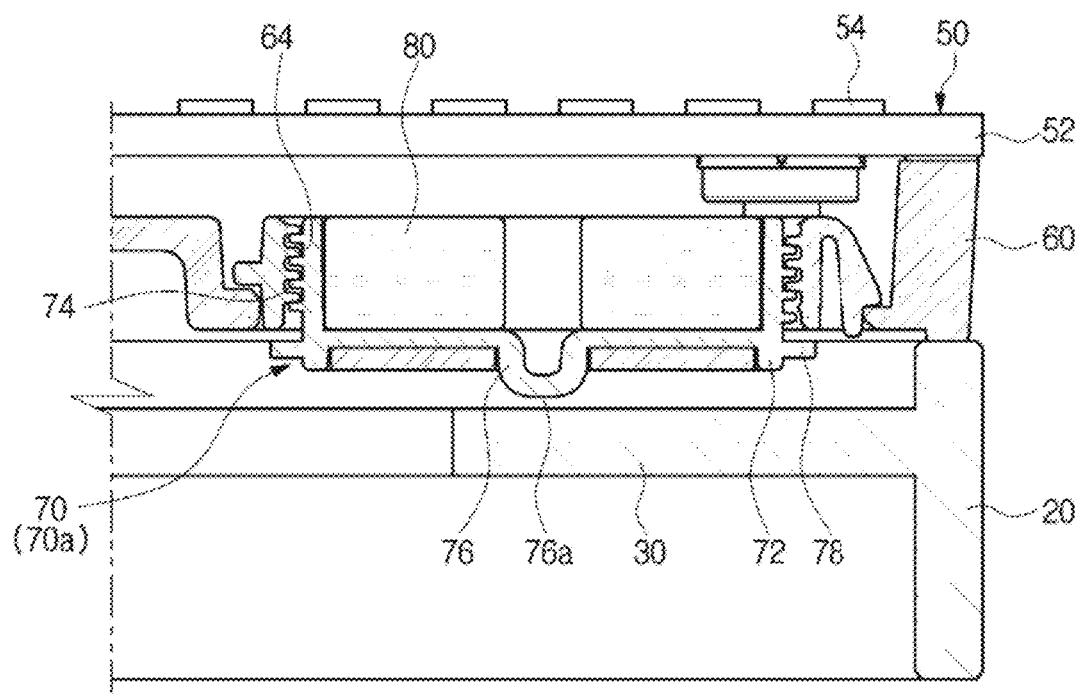
FIGS. 12 to 16 are cross-sectional views illustrating operations of a level adjusting member in a display apparatus according to an embodiment of the present disclosure.

FIG. 10 is an exploded perspective view of an LED module and a level adjusting member in a display apparatus according to an embodiment of the present disclosure, and FIG. 11 is an exploded perspective view of a level adjusting member in a display apparatus according to an embodiment of the present disclosure.

The LED module 40 may include a module bracket 60. The module bracket 60 may be disposed at the rear surface of the LED panel 50. The module bracket 60 may be configured to be fixed to the LED panel 50. The module bracket 60 may include a through hole 62 in which the first fastening member 56 is accommodated. The first fastening member 56 may be configured to be exposed to the second fastening member 22 through the through hole 62.

The display apparatus 1 may include the level adjusting member 70. The level adjusting member 70 may be a configuration of the LED module 40. The level adjusting member 70 may be configured to adjust a difference in level of the LED module 40. A plurality of the LED modules 40 may be mounted on the front bracket 20 by an attractive force between the respective first and second fastening members 56 and 22. A level difference or a level may occur between the mounted first LED module 40a and the second and third LED module 40b or 40c adjacent to the mounted first LED module 40a. The level adjusting member 70 is configured to adjust the level difference between the mounted first LED module 40a and the second and third LED module 40b or 40c adjacent to the mounted first LED module 40a. The level adjusting member 70 may be configured to move the LED module 40 in a direction opposite to the direction in which the first fastening member 56 attracts the second fastening member 22. The level adjusting member 70 may be disposed to be spaced apart from the LED module 40 so as to prevent interference with the first and second fastening members 56 and 22.

The level adjusting member 70 may be disposed at the module bracket 60. The level adjusting member 70 may be disposed between the LED panel 50 and the front bracket 20 so as not to be exposed to the outside. The level adjusting member 70 may be provided to be movable on the module bracket 60. The module bracket 60 may include a member mounting portion 64 in which the level adjusting member 70 is accommodated. Female threads may be formed on an inner surface of the member mounting portion 64 and male threads may be formed on an outer surface of the level adjusting member 70. Thereby, the level adjusting member 70 may be configured to be able to move linearly with respect to the module bracket 60 when the level adjusting member 70 is rotated. That is, the level adjusting member 70 may convert the rotational movement into a linear movement with respect to the LED module 40.

The level adjusting member 70 may include a member body 72, and at least one pair of adjusting magnets 80 accommodated inside the member body 72. The at least one pair of adjusting magnets 80 may be fixed to the member body 72.

Figure 13:
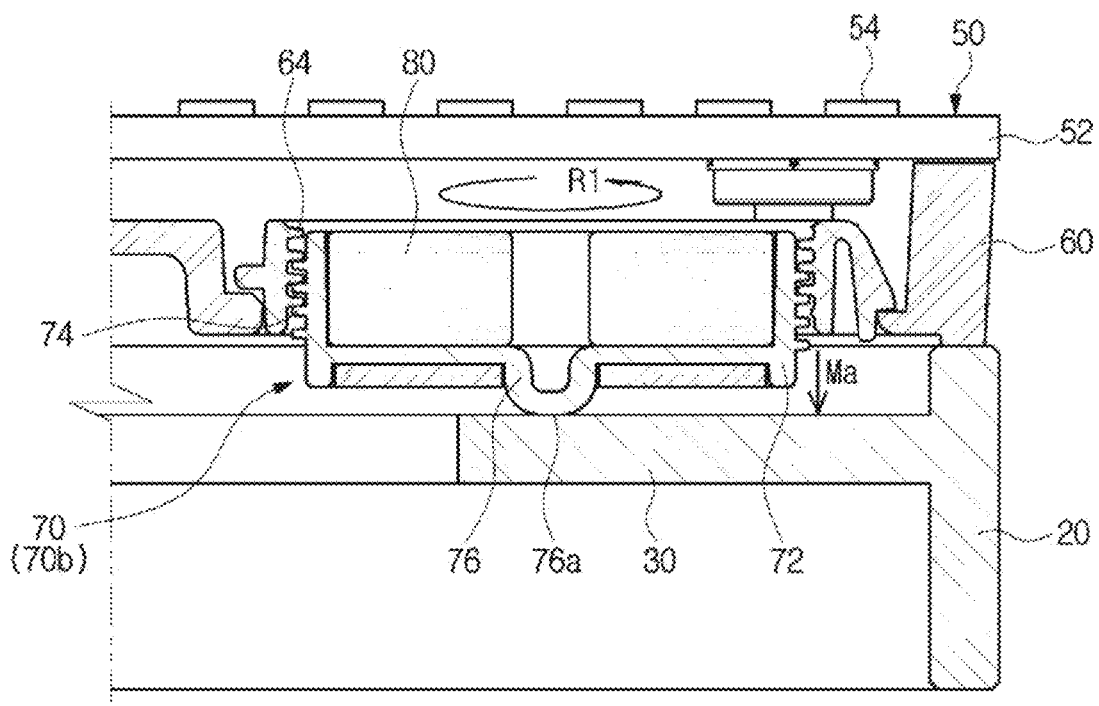
Figure 14:
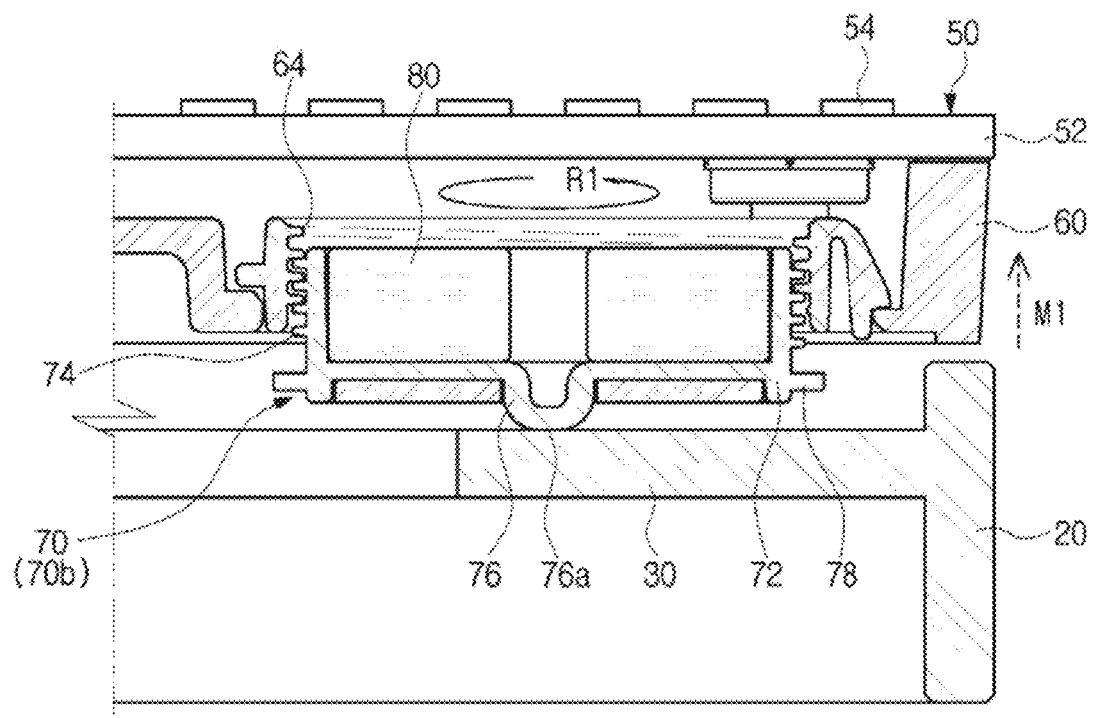
Figure 15:
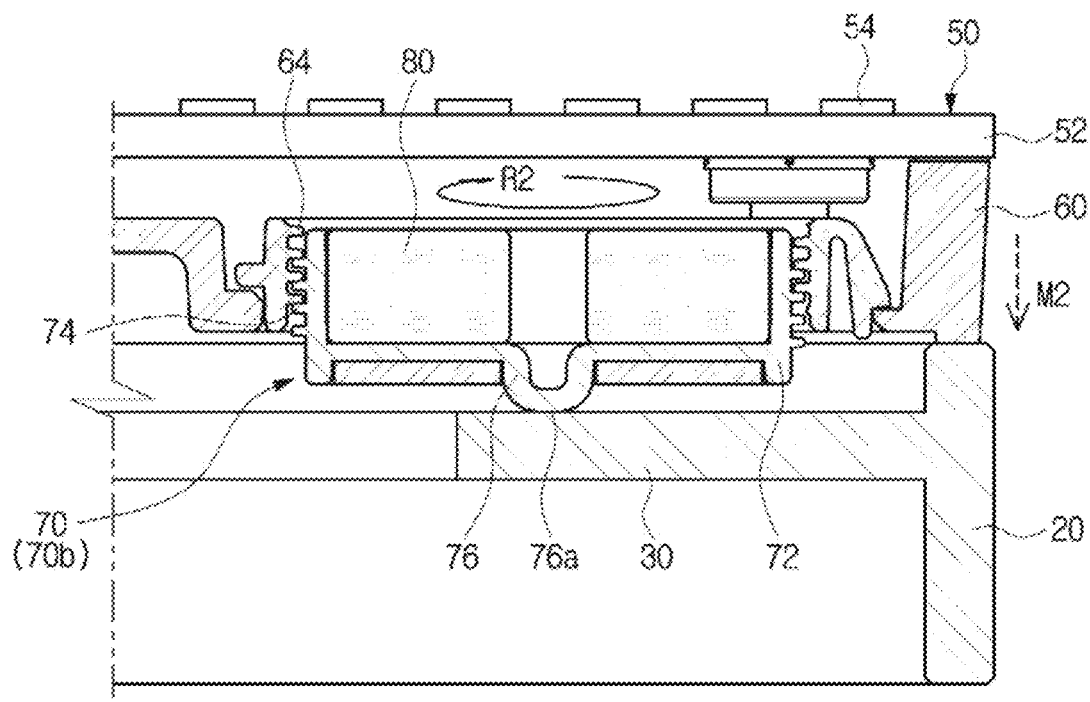
Figure 16:
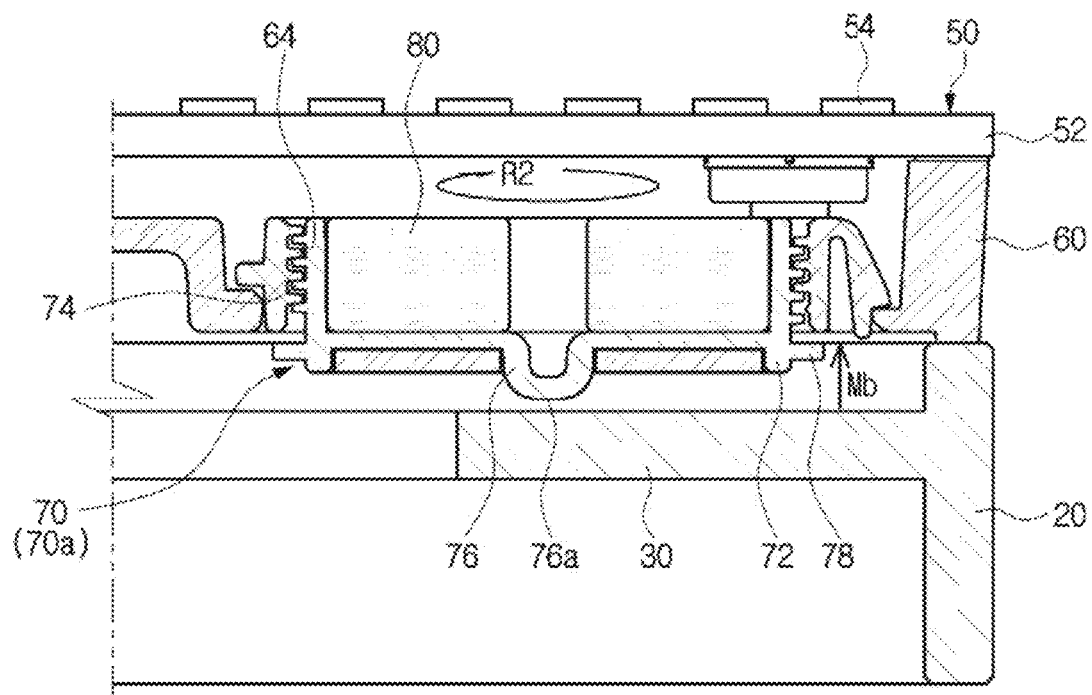
Figure 17:
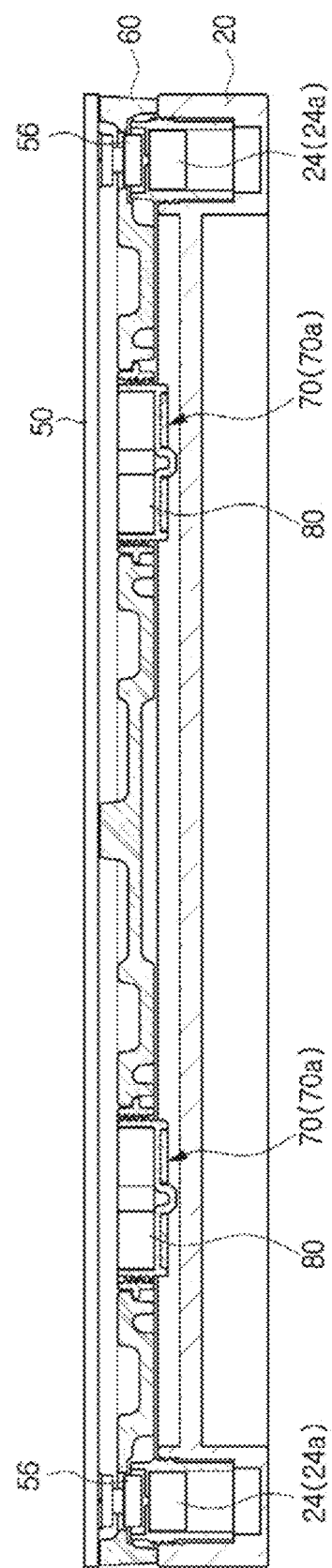
FIGS. 17 to 20 illustrate that a level adjustment movement of an LED module mounted on a front bracket is performed through a level adjusting member in a display apparatus according to an embodiment of the present disclosure.

The member body 72 may include a threaded portion 74 formed along its circumference for screw-movement of the level adjusting member 70 described above. The threaded portion 74 of the member body 72 may be formed such that the level adjusting member 70 moves along threaded grooves formed on the member mounting portion 64 of the module bracket 60. That is, by the above configuration, when the level adjusting member 70 is rotated in a direction of a first rotational movement R1 (refer to FIG. 13), the level adjusting member 70 moves in a direction away from the LED panel 50. On the contrary, when the level adjusting member 70 is rotated in a direction of a second rotational movement R2 (refer to FIG. 15) opposite to the direction of the first rotational movement R1, the level adjusting member 70 moves in a direction in which the level adjusting member 70 approaches the LED panel 50.

The pair of adjusting magnets 80 are disposed adjacent to each other, and are arranged so as to have mutually different polarities. That is, when one surface of any one of the pair of adjusting magnets 80, that faces the rear surface of the LED panel 50, has the N pole, the corresponding one surface of the other one of the adjusting magnets 80 may be arranged to have the S pole. When a pair of the adjusting magnets 80 is disposed in the member body 72, one of the two adjusting magnets 80 may be arranged such that the S pole faces the rear surface of the LED panel 50 and the other one of the two adjusting magnets 80 may be arranged such that the N pole faces the rear surface of the LED panel 50.

When two pairs of the adjusting magnets 80 are disposed in the member body 72, two of the four adjusting magnets 80 may be arranged such that the S pole faces the rear surface of the LED panel 50 and the other two of the four adjusting magnets 80 may be arranged such that the N pole faces the rear surface of the LED panel 50. In this case, the S pole and the N pole may be arranged alternately. This embodiment illustrates that two pairs of the adjusting magnets 80 are arranged alternately in the member body 72, but the present disclosure is not limited thereto. For example, 2n (n>1) of the adjusting magnets 80 may be arranged in the member body 72, and the adjusting magnets 80 may be provided such that the N and S poles are arranged alternately along a circumference of the member body 72.

The level adjusting member 70 may include at least one partition 79 partitioning between at least one pair of the adjusting magnets 80 so that the rotation of the at least one pair of adjusting magnets 80 is achieved together with the member body 72. The partition 79 is configured such that the rotational movement of the at least one pair of adjusting magnets 80 may be transmitted to the member body 72 by the partition 79, but the present disclosure is not limited thereto. That is, it is sufficient if the rotational movement of the at least one pair of adjusting magnets 80 may be transmitted to the member body 72.

The level adjusting member 70 may include a contact protrusion 76. The contact protrusion 76 may be configured to protrude from the center of the member body 72. The contact protrusion 76 may be disposed on one surface of the member body 72 that faces the front bracket 20. Specifically, the contact protrusion 76 may be disposed at the center of one surface of the member body 72 that faces the front bracket 20 for minimizing friction and stable support. The front bracket 20 may include a contact plate 30 that the contact protrusion 76 may contact. The contact protrusion 76 moves according to the movement of the level adjusting member 70 and the moved contact protrusion 76 may contact the contact plate 30 or press the contact plate 30.

The contact protrusion 76 may include a contact surface 76a (refer to FIG. 13) at least partially curved so as to be in point contact with the contact plate 30. The contact surface 76a may reduce a contact area between the contact protrusion 76 and the contact plate 30 to minimize the occurrence of friction due to rotation after the contact protrusion 76 contacts the contact plate 30.

FIGS. 12 to 16 are cross-sectional views illustrating operations of a level adjusting member in a display apparatus according to an embodiment of the present disclosure.

The level adjusting member 70 may move between a standby position 70a in which the contact protrusion 76 is spaced apart from the contact plate 30 of the front bracket 20 and a level adjustment position 70b in which the contact protrusion 76 contacts the contact plate 30. The movement of the level adjusting member 70 does not affect the movement of the LED module 40 when the level adjusting member 70 is located at the standby position 70a.

The level adjusting member 70 located at the level adjustment position 70b is brought into contact with the contact plate 30 so that the linear movement of the level adjusting member 70 with respect to the front bracket 20 is restricted. The level adjusting member 70 may rotatably contact the contact plate 30. That is, the level adjusting member 70 is configured such that the rotational movement of the level adjusting member 70 is converted into level adjustment movements M1 and M2 (refer to FIGS. 14 and 15) of the LED module 40 at the level adjustment position 70b. With this configuration, the first and second rotational movements R1 and R2 of the level adjusting member 70 may be converted into any one of linear movements Ma and Mb of the level adjusting member 70 (refer to FIGS. 13 and 16) and the level adjustment movements M1 and M2 of the LED module 40 with respect to the front bracket 20.

Hereinafter, a case where the level adjusting member 70 is located at the level adjustment position 70b will be described. The level adjusting member 70 may maintain contact with the contact plate 30 at the level adjustment position 70b. When the level adjusting member 70 is located at the level adjustment position 70b, the level adjusting member 70 may perform the level adjustment movements M1 and M2 of the LED module 40 through the rotation in the directions of the first and second rotational movements R1 and R2. In addition, the level adjusting member 70 may equally maintain a contact area between the level adjusting member 70 and the front bracket 20 while the level adjustment movements M1 and M2 of the LED module 40 are performed at the level adjustment position 70b.

When the level adjusting member 70 located at the level adjustment position 70b is rotated in the direction of the first rotational movement R1, the LED module 40 moves in the direction of the level adjustment movement M1 of being away from the front bracket 20 by moving relative to the level adjusting member 70. Also, the LED panel 50 moves in the direction of the level adjustment movement M1 of being away from the front bracket 20 by moving relative to the level adjusting member 70. That is, the LED module 40 moves in a direction of protruding forward of the front bracket 20.

When the level adjusting member 70 is rotated in the direction of the second rotational movement R2, the LED module 40 moved in the direction of protruding forward of the front bracket 20 moves in the direction of the level adjustment movement M2 of approaching the front bracket 20 by moving relative to the level adjusting member 70. Also, the LED panel 50 moved in the direction of protruding forward of the front bracket 20 moves in the direction of the level adjustment movement M2 of approaching the front bracket 20 by moving relative to the level adjusting member 70.

When the level adjusting member 70 continues to be rotated in the direction of the second rotational movement R2, the level adjusting member 70 is moved from the level adjustment position 70b to the standby position 70a to release the contact with the contact plate 30. When the level adjusting member 70 is moved to the standby position 70a in this manner, excessive movement for the level adjustment of the LED module 40 may be prevented.

Since the level adjusting member 70 is disposed in front of the contact plate 30 or disposed in contact with the contact plate 30 at the standby position 70a or the level adjustment position 70b, the level adjusting member 70 does not affect the arrangement configuration at a rear of the front bracket 20. As a result, the thickness of the display apparatus 1 may be made thinner, and the display apparatus 1 having a slim thickness may be realized. Although the present embodiment illustrates that the level adjusting member 70 is moved between the standby position 70a and the level adjustment position 70b, the present disclosure is not limited thereto. For example, when the LED module 40 is mounted on the front bracket 20, the level adjusting member 70 may not be spaced apart from the contact plate 30. That is, when the LED module 40 is mounted to the front bracket 20, the level adjusting member 70 may be located only at the level adjustment position 70b.

The level adjusting member 70 may include a moving stopper 78. The moving stopper 78 is configured to restrict the movement of the level adjusting member 70. The moving stopper 78 may be configured to protrude from the member body 72. Specifically, the moving stopper 78 may be configured to protrude radially with respect to the member body 72. At least one of the moving stoppers 78 may be provided along the circumference of the member body 72. Although the present embodiment illustrates that a pair of the moving stoppers 78 are formed on opposite sides of the member body 72, the number and arrangement thereof are not limited thereto.

When the level adjusting member 70 rotates in the direction of the second rotational movement R2 at the standby position 70a, the movement of the moving stopper 78 is restricted by the module bracket 60. The moving stopper 78 may be disposed adjacent to one surface of the member body 72 where the contact protrusion 76 is formed.

The threaded portion 74 of the level adjusting member 70 may include square threads. The LED module 40 is moved relative to the level adjusting member 70 when the level adjusting member 70 is located at the level adjustment position 70b. At this time, the level adjusting member 70 applies a force to the LED module 40 in a direction of pushing out the LED module 40 from the front bracket 20. That is, when the level adjusting member 70 is located at the level adjustment position 70b, the level adjusting member 70 linearly moves from the LED module 40 to push out the LED module 40 from the front bracket 20. As the threaded portion 74 is formed as square threads, the level adjusting member 70 may efficiently support the module bracket 60. In addition, as the threaded portion 74 is formed as square threads, the level adjusting member 70 may stably support the module bracket 60 and the LED panel 50. Further, as the threaded portion 74 is formed as square threads, the level adjusting member 70 may stably maintain the moved position of the LED module 40.

Since the LED panel 50 has a rectangular shape, the LED panel 50 may have four edges. Four of the level adjusting members 70 may be disposed on the rear surface of the LED module 40 so as to correspond to the four edges, but the number and arrangement of the level adjusting members 70 are not limited thereto. That is, the display apparatus 1 may be provided with a plurality of the level adjusting members 70 so as to correspond to a plurality of the edges, in order to adjust levels between the first LED module 40a and the second and third LED modules 40b and 40c adjacent to the first LED module 40a.

Figure 18:
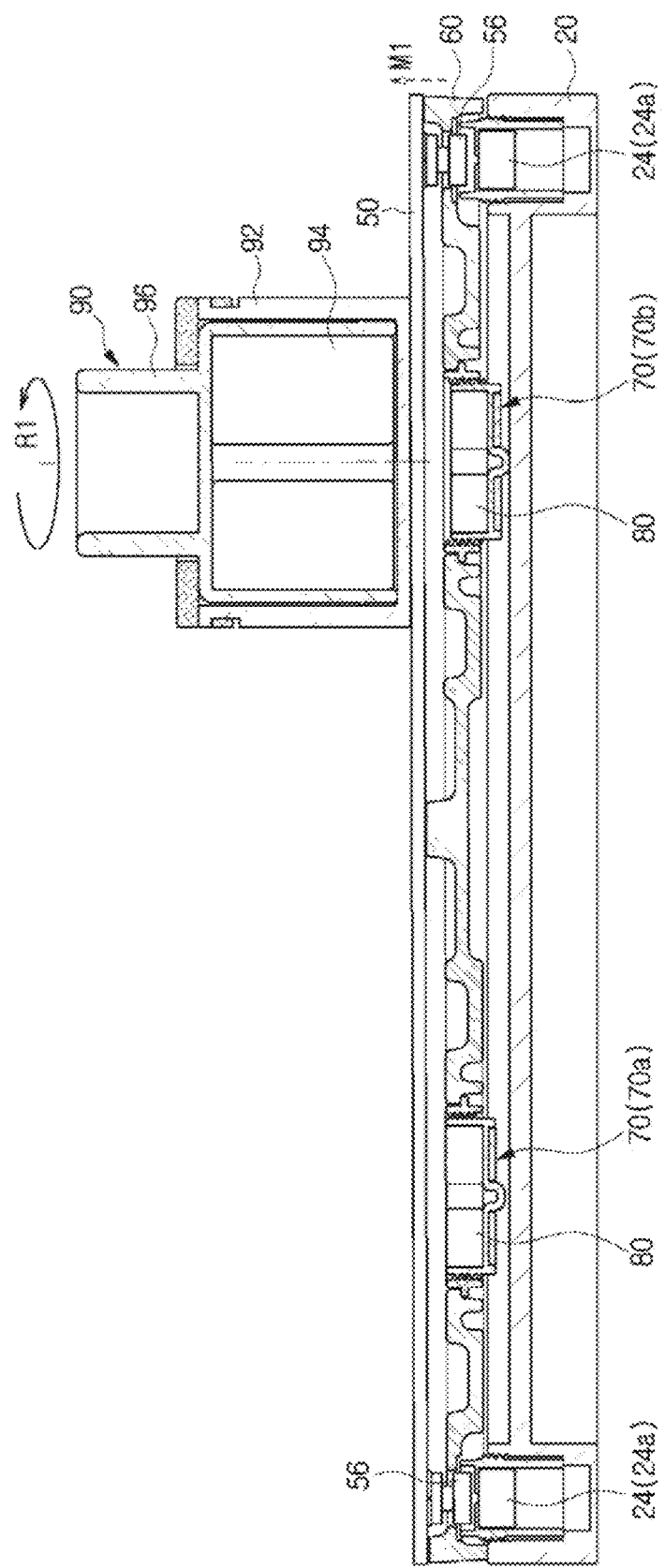

The display apparatus 1 may include an adjusting jig 90 (refer to FIG. 18). The adjusting jig 90 may include a jig housing 92 and at least one pair of moving magnets 94 disposed in the jig housing 92. The at least one pair of moving magnets 94 and at least one pair of the adjusting magnets 80 of the level adjusting member 70 may be configured to generate an attractive force therebetween when the adjusting jig 90 is brought to the front of the LED module 40. The number and arrangement of the at least one pair of moving magnets 94 may be configured to correspond to the at least one pair of adjusting magnets 80.

The adjusting jig 90 is operated by rotating the moving magnets 94. At this time, when the moving magnets 94 directly contact the LED module 40, friction due to the rotation of the moving magnets 94 is generated, and the LED module 40 is damaged. The adjusting jig 90 may include a jig rotating body 96 having the moving magnets 94 disposed therein and rotatably provided inside the jig housing 92. The jig rotating body 96 is rotatably provided inside the jig housing 92 and is configured to support the rotation of the moving magnets 94. With this configuration, the jig housing 92 contacts the LED module 40, but the rotation of the moving magnets 94 is performed inside the jig housing 92, and thus friction between the LED module 40 and the moving magnets 94 does not occur. A lower surface of the jig housing 92 may be configured to correspond to an upper surface of the level adjusting member 70.

The pair of moving magnets 94 are disposed adjacent to each other and arranged so as to have mutually different polarities. That is, when one surface of one of the pair of moving magnets 94, that faces the front surface of the LED panel 50, has the S pole, the corresponding one surface of the other one of the moving magnets 94 may be arranged to have the N pole. When one pair of the moving magnets 94 is arranged in the jig rotating body 96, in one of the two moving magnets 94, the S pole may face the front surface of the LED panel 50, and in the other one of the two moving magnets 94, the N pole may face the front surface of the LED panel 50. When two pairs of the moving magnets 94 are arranged in the jig rotating body 96, in two of the four moving magnets 94, the S pole may face the front surface of the LED panel 50, and in the other two of the four moving magnets 94, the N pole may face the front surface of the LED panel 50. In this case, the S pole and the N pole may be arranged alternately. This embodiment illustrates that two pairs of the moving magnets 94 are arranged alternately in the jig rotating body 96, but the present disclosure is not limited thereto. For example, 2n (n>1) of the moving magnets 94 may be arranged in the jig rotating body 96, and the moving magnets 94 may be provided such that the N and S poles are arranged alternately along a circumference of the jig rotating body 96.

Hereinafter, the operation of the level adjusting member 70 according to the above configuration will be described.

FIGS. 17 to 20 illustrate that a level adjustment movement of an LED module mounted on a front bracket is performed through a level adjusting member in a display apparatus according to an embodiment of the present disclosure.

After the LED module 40 is mounted on the front bracket 20 by the first and second fastening members 56 and 22, the level adjusting member 70 may be operated in order to adjust a level with respect to the adjacent LED module 40. The LED module 40 is mounted on the front bracket 20 by the first and second fastening members 56 and 22, and the distance between the LED module 40 and the front bracket 20 may be adjusted by the level adjusting member 70. That is, a level difference between the adjacent LED modules 40 may be adjusted by the level adjusting member 70.

When the adjusting jig 90 is brought to the front of the LED module 40, an attractive force is generated between at least one pair of the moving magnets 94 of the adjusting jig 90 and at least one pair of the adjusting magnets 80 of the level adjusting member 70.

Figure 19:
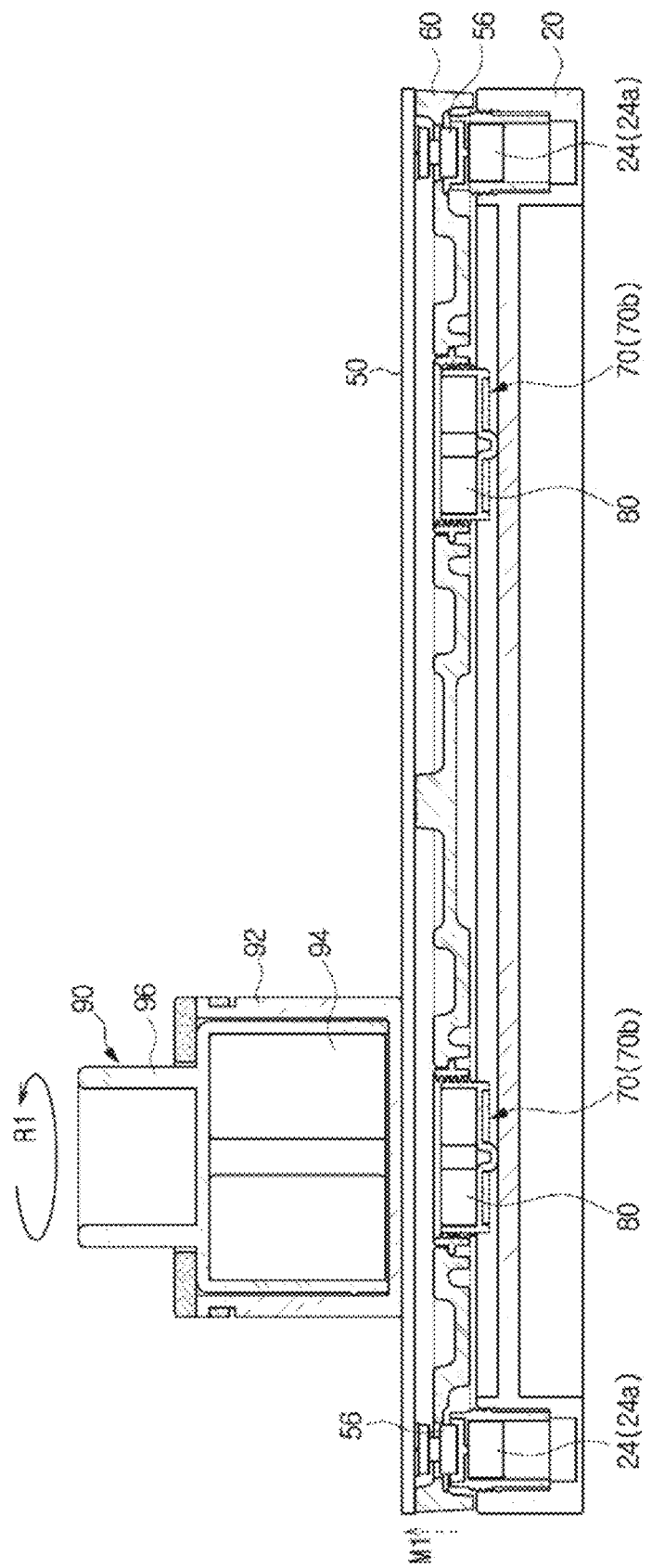

When the adjusting jig 90 is rotated in the direction of the first rotational movement R1 as illustrated in FIGS. 18 and 19, the level adjusting member 70 is also rotated in the direction of the first rotational movement R1 by an attractive force between the moving magnets 94 and the adjusting magnets 80. The level adjusting member 70 is moved from the standby position 70a to the level adjustment position 70b by the rotation in the direction of the first rotational movement R1. When the level adjusting member 70 located at the level adjustment position 70b is rotated in the direction of the first rotational movement R1, the LED module 40 is moved relative to the level adjusting member 70 and moved in a direction of being away from the front bracket 20.

Figure 20:
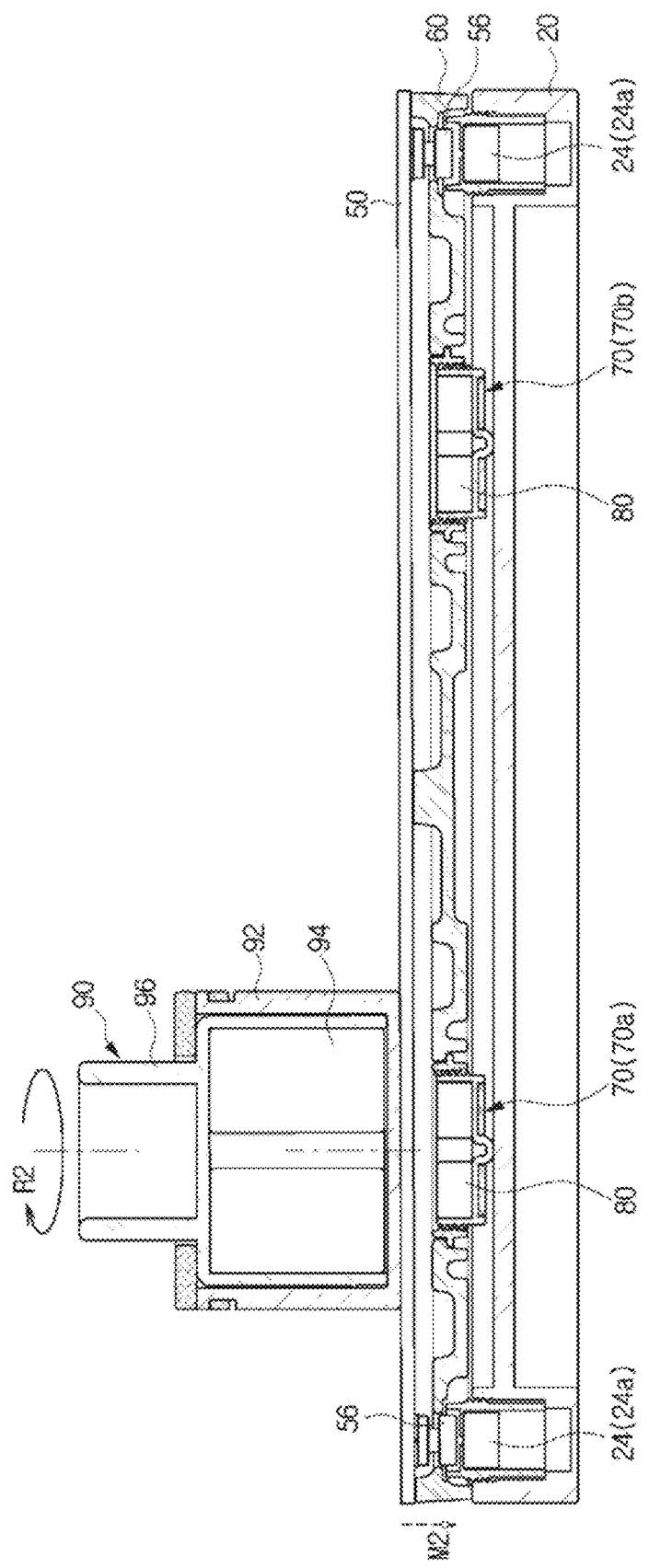

When the level adjusting member 70 is rotated in the direction of the second rotational movement R2 as illustrated in FIG. 20, the LED module 40 is moved relative to the level adjusting member 70 and moved in a direction of approaching the front bracket 20.

When the level adjusting member 70 continues to be rotated in the direction of the second rotational movement R2, the level adjusting member 70 is moved from the level adjustment position 70b to the standby position 70a to release the contact with the contact plate 30.

As is apparent from the above, according to an aspect of the present disclosure, a display module is easy to move and can be easily connected to another display module using a connecting device included in a cabinet.

Further, according to an aspect of the present disclosure, a level difference between a plurality of display modules can be adjusted using a level adjusting member of the plurality of display modules included in a display apparatus.

Further, according to an aspect of the present disclosure, a level difference between LED panels is easily adjusted without performing a separate disassembly operation to adjust the level difference between the LED panels.

Although a few embodiments of the present disclosure have been shown and described, it would be appreciated by those skilled in the art that changes may be made in these embodiments without departing from the principles and spirit of the disclosure in the scope of which is defined in the claims and their equivalents.

What is claimed is:

1. A display apparatus, comprising:
 a light-emitting diode (LED) module having a first fastening member;
 a front bracket having a second fastening member on which the LED module is mountable by an attractive force generated between the first fastening member and the second fastening member; and
 at least one level adjusting member disposed between the LED module and the front bracket, the at least one level adjusting member being rotatable by an external magnetic force and is able to move the LED module in a direction opposite to a direction of the attractive force generated between the first fastening member and the second fastening member,
 wherein the at least one level adjusting member is configured to convert a rotational movement of the at least one level adjusting member due to the external magnetic force into a level adjustment movement of the LED module with respect to the front bracket,
 wherein the at least one level adjusting member is configured to be able to:
  linearly move toward the LED module as the at least one level adjusting member is being rotated in a first rotation direction,
  linearly move away from the LED module as the at least one level adjusting member is being rotated in a second rotation direction which is opposite the first rotation direction, and
  perform the level adjustment movement, in which the LED module is able to be moved relative to the front bracket on which the LED module is mounted, when the at least one level adjusting member is in contact with the front bracket subsequent to the at least one level adjusting member being linearly moved toward the LED module,
 wherein the at least one level adjusting member is able to move between:
  a standby position in which the at least one level adjusting member is spaced apart from the front bracket and no level adjustment movement of the LED module occurs due to the rotational movement of the at least one level adjusting member, and
  a level adjustment position in which the at least one level adjusting member is in contact with the front bracket and the level adjustment movement in which the LED module moves with respect to the front bracket to be performed.

2. The display apparatus according to claim 1, wherein:
the LED module and the at least one level adjusting member are configured to move relative to each other whereby the LED module is able to be moved away from the front bracket as the at least one level adjusting member is linearly moved toward the LED module and the LED module is able to be moved toward the front bracket as the at least one level adjusting member linearly moves away from the LED module.

3. The display apparatus according to claim 1, wherein:
the at least one level adjusting member remains restricted from being linearly moveable while in contact with the front bracket.

4. The display apparatus according to claim 1, wherein:
the at least one level adjusting member is configured to maintain contact with the front bracket while the level adjustment movement of the LED module is performed while the at least one level adjusting member is in the level adjustment position.

5. The display apparatus according to claim 1, wherein:
the LED module includes an LED panel, and a module bracket disposed on a rear surface of the LED panel and on which the at least one level adjusting member is movably disposed.

6. The display apparatus according to claim 5, wherein:
the at least one level adjusting member includes a member body having threads formed on an outer circumferential surface thereof so as to be screw-movable with respect to the module bracket, and a plurality of adjusting magnets fixedly disposed inside the member body to generate an attraction force together with the external magnetic force.

7. The display apparatus according to claim 6, wherein:
the at least one level adjusting member includes a contact protrusion having a curved contact surface, the contact protrusion formed to protrude from one surface of the member body facing the front bracket, and
the front bracket includes at least one contact plate facing the at least one level adjusting member which the curved contact surface rotatably contacts while the at least one level adjusting member is at the level adjustment position.

8. The display apparatus according to claim 6, wherein:
the threads include square threads having a square cross section to maintain a position of the LED module with respect to the front bracket.

9. The display apparatus according to claim 6, wherein:
while the one level adjusting member is rotated in the first rotation direction, the at least one level adjusting member is able to be moved from the standby position to the level adjustment position,
while the one level adjusting member is rotated in the second rotation direction, the at least one level adjusting member is able to be moved from the level adjustment position to the standby position, the second rotation direction being in a direction opposite to a direction of the first rotation direction, and
the at least one level adjusting member includes a moving stopper protruding from a circumference of the member body to prevent a movement in the second rotation direction from the standby position by being restricted by the module bracket.

10. The display apparatus according to claim 5, wherein:
the LED panel includes a plurality of edges forming a circumference thereof, and
the at least one level adjusting member is among a plurality of the level adjusting members each corresponding to the plurality of edges for level adjustment at the plurality of edges.

11. The display apparatus according to claim 1, wherein:
the LED module is mounted on the front bracket by the attractive force, and a distance between the LED module and the front bracket is adjusted by the at least one level adjusting member.

12. The display apparatus according to claim 1, wherein:
the at least one level adjusting member is disposed on the LED module so as to be spaced apart from the first fastening member and the second fastening member.

13. The display apparatus according to claim 1, wherein:
the at least one level adjusting member is configured to adjust a level difference between the LED module and another adjacent LED module.

14. A display apparatus, comprising:
an LED module including an LED panel and a module bracket to support a rear surface of the LED panel;
a front bracket on which the LED module is mountable; and
at least one level adjusting member positioned between the LED module and the front bracket, and the at least one level adjusting member being disposed on the module bracket to adjust a level difference between the LED module and another LED module adjacent to the LED module,
the at least one level adjusting member including:
 a plurality of adjusting magnets to rotationally move the at least one level adjusting member, and
 a member body in which the plurality of adjusting magnets are fixedly disposed, the member body being configured such that a linear movement of the member body is restricted while in contact with the front bracket, and
wherein the at least one level adjusting member is configured to convert a rotational movement of the at least one level adjusting member due to the external magnetic force into a level adjustment movement of the LED module with respect to the front bracket,
wherein the at least one level adjusting member is configured to be able to:
 linearly move toward the LED module as the at least one level adjusting member is being rotated in a first rotation direction,
 linearly move away from the LED module as the at least one level adjusting member is being rotated in a second rotation direction which is opposite the first rotation direction, the at least one level adjusting member is being rotated by an external magnetic force, and
 perform the level adjustment movement, in which the LED module is able to be moved relative to the front bracket on which the LED module is mounted, when the linear movement of the member body is restricted due to contact with the front bracket subsequent to the at least one level adjusting member being linearly moved toward the LED module,
wherein the at least one level adjusting member is able to move between:
 a standby position in which the at least one level adjusting member is spaced apart from the front bracket and no level adjustment movement of the LED module occurs due to the rotational movement of the at least one level adjusting member, and
 a level adjustment position in which the at least one level adjusting member is in contact with the front bracket and the level adjustment movement in which the LED module moves with respect to the front bracket to be performed.

15. The display apparatus according to claim 14, wherein:
the at least one level adjusting member maintains contact with the front bracket while the level adjustment movement of the LED module is performed.

16. A display apparatus, comprising:
an LED module;
a front bracket on which the LED module is mounted; and
at least one level adjusting member positioned between the LED module and the front bracket, the at least one level adjusting member being configured to be that is rotatable by an external magnetic force,
wherein the at least one level adjusting member is configured to convert a rotational movement of the at least one level adjusting member due to the external magnetic force into a level adjustment movement of the LED module with respect to the front bracket,
the at least one level adjusting member configured to be able to:
 linearly move toward the LED module as the at least one level adjusting member is being rotated in a first rotation direction,
 linearly move away from the LED module as the at least one level adjusting member is being rotated in a second rotation direction which is opposite the first rotation direction, and
 adjust a distance between the LED module and the front bracket when the at least one level adjusting member is in contact with the front bracket subsequent to the at least one level adjusting member being linearly moved toward the LED module,
wherein the at least one level adjusting member is able to move between:
 a standby position in which the at least one level adjusting member is spaced apart from the front bracket and no level adjustment movement of the LED module occurs due to the rotational movement of the at least one level adjusting member, and a level adjustment position in which the at least one level adjusting member is in contact with the front bracket and the level adjustment movement in which the LED module moves with respect to the front bracket to be performed.

17. The display apparatus according to claim 16, wherein:
the at least one level adjusting member performs a lifting movement of the LED module with respect to the front bracket when the at least one level adjusting member is restricted from being linearly moveable by the front bracket.

\* \* \* \* \*